May 13, 1969 C. S. DUNCAN ET AL 3,444,006

THERMOELECTRIC ELEMENT HAVING A DIFFUSION BONDED COATING

Filed Dec. 16, 1963

WITNESSES

Theodore F. Wrobel

Thomas J. Flynn

INVENTORS
Charles S. Duncan
and Samuel Scuro, JR.
BY
C. L. Menzemer
ATTORNEY

United States Patent Office 3,444,006

Patented May 13, 1969

3,444,006

THERMOELECTRIC ELEMENT HAVING A DIFFUSION BONDED COATING

Charles S. Duncan and Samuel J. Scuro, Penn Hills, Pa., assignors to Westinghouse Electric Corporation, Pittsburgh, Pa., a corporation of Pennsylvania Filed Dec. 16, 1963, Ser. No. 331,043
Int. Cl. H01v *1/02*
U.S. Cl. 136—238 8 Claims The present invention relates to an improvement in the operating efficiency of thermoelectric devices.

The overall efficiency of a thermoelectric device may be defined by the following mathematical equations:

$$\text{Efficiency}=\frac{\text{Power Output}}{\text{Power Input}}\times\frac{\Delta T}{T_C}$$

where $$\Delta T\times\frac{T_H-T_C}{T_C}$$

wherein $\Delta T$=the difference between the hot junction temperature ($T_H$) and cold junction temperatures ($T_C$)
$T_H$=the hot junction temperature (° K.)
$T_C$=the cold junction temperature (° K.)
Power Output=electrical power delivered by the device (watts)
Power Input=thermal energy supplied to the device (watts)

It is apparent that other parameters remaining constant, an increase in the $\Delta T$ in the above equations results in an increase in the efficiency of the thermoelectric device. Therefore, if $T_H$, the temperature at the hot junction contact of a thermoelectric device, is increased, the $\Delta T$ will be increased and in turn the efficiency of the device will be increased.

One of the limiting factors in increasing the hot junction operating temperature ($T_H$) of a thermoelectric device is the temperatures at which various thermoelectric materials begin to vaporize. Thus the temperature at which the thermoelectric material used in the thermoelectric device vaporizes is a limitation on the maximum hot junction operating temperature. Examples of thermoelectric materials that are subjected to vaporization are germanium bismuth telluride, which begins to vaporize at about 450° C., lead telluride which begins to vaporize at about 700° C., germanium telluride which begins to vaporize at about 500° C., and zinc antimonide which begins to vaporize at about 400° C.

It is an object of this invention to provide a means for increasing the efficiency of thermoelectric devices.

It is another object of the present invention to increase the efficiency of a thermoelectric device by providing for increased operating temperatures at the hot junction contact of thermoelectric devices.

It is another object of this invention to provide a thin walled coating of a low melting temperature, low vaporization point metal completely surrounding a thermoelectric pellet and extending from at least the hot junction contact to substantially the cold junction contact of the thermoelectric element, the exact length of the thin walled coating depending on the nature of the thermoelectric material thereby preventing vaporization of the thermoelectric material during operation.

Other objects of the invention will, in part, be obvious and will, in part, appear hereinafter.

In order to more fully understand the nature and objects of the invention reference should be had to the following detailed description and drawings, in which.

In accordance with the present invention and in attainment of the foregoing objects there is provided a thermoelectric element suitable for use in a thermoelectric device comprising a body of thermoelectric material, good thermally and electrically conductive contact members joined to two opposite ends of the element, said contact members forming the hot and cold junction contacts when said body is used in a thermoelectric device and a thin walled coating of a low melting temperature metal completely surrounding the body of thermoelectric material and extending from that end of the body of thermoelectric material which constitutes the hot junction when the body is employed in a thermoelectric device to substantially the other end, said other end constituting the cold junction when the body is employed in a thermoelectric device.

Figure 1:
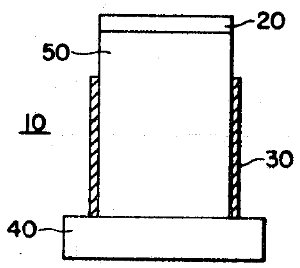
FIG. 1 is a view, partially in cross section, of a thermoelectric pellet with a thin walled coating of metal extending from the hot junction contact to a point along the vertical axis of the pellet.

Referring to FIG. 1, there is shown a thermoelectric element 10 produced in accordance with the teachings of this invention. The element 10 is comprised of a body 50 of thermoelectric material such as for example, germanium bismuth telluride, lead telluride, zinc antimonide, germanium telluride and sulfides and selenides of the Lathenum rare earth elements. Generally, the teaching of this invention is applicable when metallic sulfides, selenides, antimonides and tellurides are used as a thermoelectric material. A hot junction contact 40 comprising a good thermally conductive and electrically conductive metal such as for example, iron, nickel, copper or stainless steel is joined to one end of the thermoelectric body 50. A cold junction contact 20 of a good electrically and thermally conductive metal such as for example, iron, nickel, copper or stainless steel is joined to the other end of the thermoelectric body 50. A thin walled coating 30 of a low melting temperature and a low vaporization point metal such as for example, tin, indium, lead, zinc, gallium and alloys thereof completely surrounds the thermoelectric body 50 and extends from the hot junction contact 40 to a point along the vertical axis toward the cold junction of the thermoelectric body 50.

As shown in FIG. 1, the thin walled coating of metal 30 extends from the hot junction contact 40 to a point approximately 75% of the vertical length of the body of material 50.

It will be appreciated that the vertical length of the thin walled metal coating may extend from the hot junction contact to a distance of up to 95% of the vertical length of any particular thermoelectric pellet which is used in the teachings of this invention. Generally, the preferred length of the thin walled coating is of the order of 25 to 75% of the vertical length of the thermoelectric pellet. The exact length of the thin walled coating depending upon the temperature to be maintained at the hot junction of the thermoelectric pellet.

The following example is illustrative of the teachings of this invention.

A thermoelectric pellet of germanium bismuth telluride measuring 0.375 inch long by 0.50 inch in diameter is used as the starting material. Hot and cold junction contacts are applied to the opposite ends of the thermoelectric pellet by the diffusion technique described in copending application Ser. No. 220,665, now Patent No. 3,330,029.

The material used for the hot and cold junction contact is stainless steel straps.

A thin walled coating of tin is applied to the germanium bismuth telluride pellet by the use of an ultrasonic soldering iron. The tin is applied with a soldering iron and extends from the hot junction contact to a distance of 0.125 inch along the vertical axis of the pellet. The thin walled coating of tin wetted the germanium bismuth telluride. The tin wetted germanium bismuth telluride pellet is then heat treated for ten minutes at 550° C. in an argon atmosphere. This resulted in a diffusion bonding between the tin coating and the germanium bismuth telluride.

The assembly is then cooled and used as the p leg in a thermoelectric device, with the n leg being a lead telluride pellet having stainless steel contacts joined to opposite ends by the aforementioned diffusion technique.

The lead telluride pellet is not coated with a thin walled coating since it is not to be operated at a temperature at which appreciable vaporization would take place.

Figure 2:
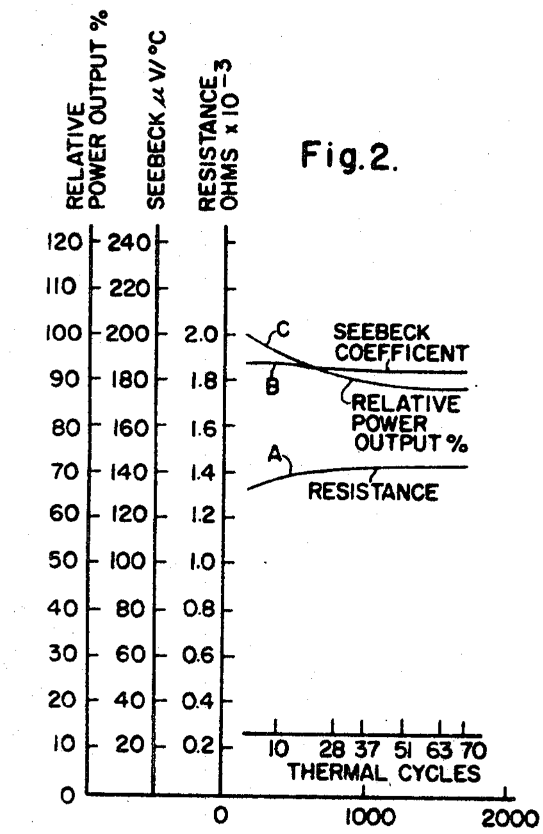
FIG. 2 is a graph indicating the results of life tests on a germanium bismuth telluride thermoelectric pellet treated in accordance with the teachings of this invention.
Figure 3:
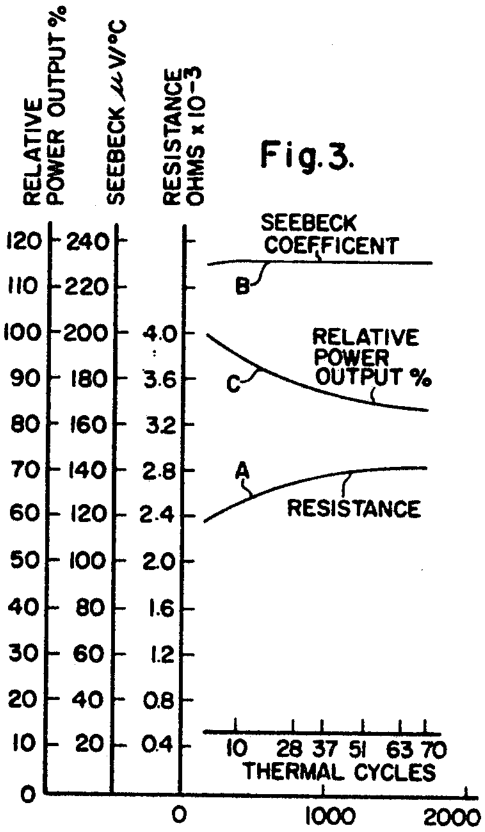
FIG. 3 is a graph indicating the results of life tests on a lead telluride pellet treated in accordance with the teachings of this invention.

The germanium bismuth telluride coated with the thin layer of tin is operated at an average hot junction temperature of 500° C., the average cold junction temperature being 130° C. with the initial power output being 1.49 watts. The pellet is operated at these temperatures for 2,000 hours with 70 thermal cycles between 25° C. and 500° C. being made. FIG. 2 shows data of life tests performed on the pellet. Line A is the resistance measured in ohms$\times 10^{-3}$, line B is the Seebeck coefficient measured in microvolts per degree centigrade, and line C is the relative power output, measured in percentage based on the initial power being 100%. There was no vaporization of the germanium bismuth telluride during the operation of the device.

Since the germanium bismuth telluride which is known to vaporize at 450° C. is operated at a temperature of 500° C. there is shown a marked improvement in the $\Delta T$ of the device. This results in an overall increase in efficiency.

The excellent results obtained are due to the thin walled coating of tin applied to the germanium bismuth telluride. Because it is a thin walled coating, a temperature difference is achieved along its vertical dimension. The upper extremity of the thin walled portion must, while in operation, reach a temperature which is not in excess of the allowable temperature value for the exposed germanium bismuth telluride, in this case 450° C. The portion of the germanium bismuth telluride which is contained inside the thin walled coating will be protected and consequently can be operated above 450° C. without harmful vaporization taking place.

It will be appreciated that equally good results can be obtained by substituting other low melting temperature, low vaporization temperature metals such as lead, indium, zinc, gallium and alloys thereof for the tin in the example.

While in the example the thermoelectric pellet of germanium bismuth telluride measured 0.375 inch in vertical length in the thin walled coating measured 0.125 inch along this vertical length or roughly 33⅓% of the total length of the pellet, it will be appreciated that the vertical length of the thin walled coating may extend from the hot junction contact to a distance of up to 95% of the vertical length of any particular thermoelectric pellet which may be used. Generally the preferred length would be on the order of 25 to 75% of the vertical length of the thermoelectric pellet. The exact length of the thin wall coating depending of course, as pointed out above, on the temperature gradient of the thermoelectric pellet over its length.

Figure 4:
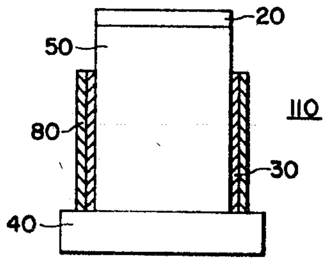
FIG. 4 is a view, partially in cross section of another embodiment of the present invention.

Referring to FIG. 4 there is shown another embodiment of the present invention. There is shown the thermoelectric device 110 which is a modification of the thermoelectric device 10 shown in FIG. 1. A second coating 80 of metal extends from the hot junction contact 40 and surrounds the thin walled coating 30 of metal. Generally the second coating 80 of metal is the same metal used as the hot junction contact 40, such as for example iron, nickel, copper and stainless steel.

It will also be appreciated that the teachings of the invention are equally applicable to other thermoelectric materials such as lead telluride, germanium telluride, zinc antimonide, lead telluride selenide, lead telluride sulfide and sulfides and selenide compounds of the Lathenum rare earth series of elements.

It is intended that the foregoing description and drawings be interpreted as illustrative and not limiting.

We claim as our invention:

1. A thermoelectric element suitable for use in a thermoelectric device comprising a body having opposite end portions defining a vertical length and a horizontal portion; said body comprising a thermoelectric material selected from the group consisting of metallic sulfides, selenides, antimonides, and tellurides; metal contact members; said metal contact members being thermally and electrically conductive metals; said metal contact members being joined to said opposite end portions; a thin walled diffusion bonded coating of metal; said metal selected from the group consisting of tin, lead, indium, zinc, gallium, and alloys thereof; said thin walled coating completely surrounding the horizontal portion of said thermoelectric material and extendng from 25% to 95% of the vertical length of said body of thermoelectric material; said thin walled coating being diffusion bonded to said thermoelectric material so as to enable the device to be used above the melting point of said metal and above the vaporization temperature of said thermoelectric material.

2. A thermoelectric element suitable for use in a thermoelectric device comprising a thermoelectric body having opposite end portions defining a vertical length and a horizontal portion; said body comprising a thermoelectric material selected from the group consisting of lead telluride, germanium bismuth telluride, germanium telluride and zinc antimonide; a thermally conductive contact member; said contact member being a metal selected from the group consisting of iron, nickel, copper and stainless steel; said thermoelectric material joined to said contact member at one end portion; a thin walled diffusion bonded coating of metal; said metal selected from the group consisting of tin, lead, indium, zinc, gallium and alloys thereof; said thin wall coating completely surrounding the horizontal portion of said body of thermoelectric material and extending from 25% to 95% of the vertical length of said body of thermoelectric material; said thin walled coating being diffusion bonded to said thermoelectric material so as to enable the device to be used above the melting point of said metal and above the vaporization temperature of said thermoelectric material.

3. A thermoelectric element suitable for use in a thermoelectric device comprising the thermoelctric element of claim 2 having additionally a second metal coating; said second metal coating being a thermally and electrically conductive metal completely surrounding the horizontal portion of said first coating of metal and extending from one end of said first coating to the other end of said first coating.

4. A thermoelectric element suitable for use in a thermoelectric device comprising a pellet having opposite end portions defining a vertical length and a horizontal portion; said pellet comprising germanium bismuth telluride; a hot junction contact; said hot junction contact being a metal selected from the group consisting of iron, nickel, copper and stainless steel; said hot junction contact joined to at least one end of said pellet; a thin walled diffusion bonded coating of tin; said thin walled coating of tin completely surrounding the horizontal portion of said germanium bismuth telluride pellet and extending from 25% to 95% of the vertical length of said germanium bismuth telluride pellet; said thin walled coating of tin being diffusion bonded to said germanium bismuth telluride pellet so as to enable the device to be used above the melting point of said tin and above the vaporization temperature of said germanium bismuth telluride.

5. A thermoelectric element comprising a body having opposite end portions defining a vertical length and a horizontal portion; said thermoelectric material selected from the group consisting of germanium bismuth telluride and lead telluride; a thermally and electrically conductive contact member; said contact member being affixed to at least one end of said thermoelectric material; a thin walled diffusion bonded metal coating; said metal coating being selected from the group consisting of lead, tin and alloys thereof; said thin walled coating of metal completely surrounding the horizontal portion of said thermoelectric material and extending from 25% to 95% of the vertical length of said thermoelectric material; said thin walled coating being diffusion bonded to said thermoelectric material so as to enable the device to be used above the melting point of said metal and above the vaporization temperature of said thermoelectric material.

6. A thermoelectric element comprising a body having opposite end portions defining a vertical length and a horizontal portion; said body comprising lead telluride; a thin walled diffusion bonded coating of lead; said lead coating completely surrounding the horizontal portion of said lead telluride body and extending from 25% to 95% of the vertical length of said lead telluride body; said thin walled coating of lead being diffusion bonded to said lead telluride body so as to enable said element to be used above the melting point of said lead and above the vaporization temperature of said lead telluride.

7. A thermoelectric element comprising a body having opposite end portions defining a vertical length and a horizontal portion; said body comprising germanium bismuth telluride; a thin wall diffusion bonded coating of tin; said tin coating completely surrounding the horizontal portion of said germanium bismuth telluride body and extending from 25% to 95% of the vertical length of said germanium bismuth telluride body; said thin walled coating of tin being diffusion bonded to said germanium bismuth telluride body so as to enable said element to be used above the melting point of said tin and above the vaporization temperature of said germanium bismuth telluride.

8. A thermoelectric element suitable for use in a thermoelectric device comprising the thermoelectric element of claim 7 in which said thin walled coating of tin extends from 25% to 75% of the vertical length of said germanium bismuth telluride.

References Cited

UNITED STATES PATENTS

| | | | |
|---|---|---|---|
| 433,451 | 8/1890 | Dickerson | 136—230 |
| 767,985 | 8/1904 | Stone | 136—224 X |
| 1,664,720 | 4/1928 | Woodruff | 136—211 |
| 2,496,346 | 2/1950 | Haayman et al. | 136—237 X |
| 2,838,589 | 6/1958 | Hunrath | 136—236 X |
| 2,126,656 | 8/1938 | Pack | 136—211 |
| 2,952,725 | 9/1960 | Evans et al. | 136—211 X |
| 3,031,516 | 4/1962 | Pessel | 136—236 X |
| 3,214,295 | 10/1965 | Danko et al. | 136—202 |
| 3,182,391 | 5/1965 | Charland et al. | 136—236 X |
| 3,272,660 | 9/1966 | Intrater et al. | 136—205 |
| 3,279,955 | 10/1966 | Miller et al. | 136—205 |

A. B. CURTIS, *Primary Examiner.*

U.S. Cl. X.R.

29—573; 136—240